United States Patent [19]

Bogner

[11] Patent Number: 4,733,369
[45] Date of Patent: Mar. 22, 1988

[54] METHOD FOR PROVIDING SEPARATELY ADJUSTABLE VOLTAGE DEPENDENT OPTICAL PROPERTIES

[76] Inventor: Udo Bogner, Othlostrasse 9, D-8400 Regensburg, Fed. Rep. of Germany

[21] Appl. No.: 822,142

[22] Filed: Jan. 24, 1986

Related U.S. Application Data

[63] Continuation of Ser. No. 415,903, Sep. 8, 1982, abandoned.

[30] Foreign Application Priority Data

Sep. 9, 1981 [DE] Fed. Rep. of Germany ....... 3135591

[51] Int. Cl.$^4$ .............................................. G11C 13/00
[52] U.S. Cl. ..................................... 365/119; 372/42; 365/215; 350/397
[58] Field of Search ............... 365/119, 106, 114, 215, 365/125, 153; 350/397; 372/42

[56] References Cited

U.S. PATENT DOCUMENTS

| | | | |
|---|---|---|---|
| 3,673,578 | 6/1972 | Schneider | 365/119 |
| 4,091,375 | 5/1978 | Rebillard | 365/119 |
| 4,101,976 | 7/1978 | Castro | 365/119 |

FOREIGN PATENT DOCUMENTS

| | | | |
|---|---|---|---|
| 2222920 | 11/1972 | Fed. Rep. of Germany | |
| 1351812 | 5/1974 | United Kingdom | 365/119 |

OTHER PUBLICATIONS

Jipson et al., "Triarylamine Radical Cations as Dyes for Optical Storage Media", IBM Tech. Disc. Bull., vol. 25, No. 1, Jun. 1982, pp. 51-53.
Gutiérrez et al, "Multiple Photochemical Hole Burning in Organic Glasses and Polymers: Spectroscopy and Storage Aspects", IBM Journal Res. Development, vol. 26, No. 2, Mar. 1982, pp. 198-208.
Shatuck et al, "Photovoltaic Switching of Electrochromic Materials", IBM Tech. Disc. Bull., vol. 17, No. 9, Feb. 1975, pp. 2778.
Bogner, "Selectively Laser Excited Perylene, Matrix Isolated in Langmuir Films, Providing a Phonon Memory", Physical Review Letters, vol. 37, No. 14, 10-4-76, pp. 909-912.
Castro et al, "Magnetic and Electric Field Addressing of Photochemical Hole Burning Memories", IBM Technical Disclosure Bulletin, vol. 21, No. 8, Jan. 1979, p. 3333.
Sharma, Halme & Butusov, *Optical Fiber Systems and Their Components*, p. 126, et seq., Springer-Verlag Berlin, Heidelburg, New York (1981).
Ping King Tien & Giordman, *Building the Integrated Optical Circuit*, Optical Spectra (Jun. 1981).

*Primary Examiner*—Stuart N. Hecker
*Assistant Examiner*—Glenn A. Gossage
*Attorney, Agent, or Firm*—Charles W. Fallow; Martin P. Hoffman; Mitchell B. Wasson

[57] ABSTRACT

The electro-optical method described herein provides adjustable voltage dependent optical properties of a solid whereby the characteristics, i.e., the optical response to applied voltage, are separately adjustable for different laser frequencies. The solid has photo-absorbing centers capable of displaying persistent spectral hole burning; the spectral holes are capable of exhibiting electric-field induced filling. The main fields of application for this method are in integrated optics, image processing, and optical data storage.

5 Claims, 6 Drawing Figures

METHOD FOR PROVIDING SEPARATELY ADJUSTABLE VOLTAGE DEPENDENT OPTICAL PROPERTIES

This is a continuation of application Ser. No. 415,903 filed on Sept. 8, 1982, now abandoned.

BACKGROUND

This invention relates to electro-optical systems and methods of providing such devices whose optical properties in dependence on applied voltage can be adjusted. It can be used also to provide a memory of the applied voltages and/or for coupling electronic and optical parts of an apparatus.

The invention can be applied to integrated optical circuits, the optical transmission of information, the optical storage of data and images for example in computers and holograms, computer optical logic, optoelectronic and similar areas in which voltage-dependent optical devices are advantageously applicable.

Various devices are known in this field which enable a connection between electronic and optical elements of systems. These devices are made of crystalline solids and the changes in the optical properties result from relatively high voltages (over 15 V), e.g. by the linear electro-optical effect (Pockels-effect), which further requires polarized light, or these changes are obtained, e.g. by means of piezo-electrically generated sound waves, but here the rise time is limited by the time required to achieve stable oscillations. None of the known voltage-dependent optical devices has at the same time the function of a voltage-memory [see, e.g., A. B. Sharma, S. H. Halem, M. M. Butusov (Editor), "Optical Fiber Systems and their Components", page 126, Springer-Verlag Berlin (1981) or Ping-King Tien and Joseph A. Giordmaine, "Building the Integrated Optical Circuit", Optical Spectra, June 1981, page 50].

The present invention is based on the selective excitation (i.e. excitation in certain selected levels) of a solid in which are isolated photo-absorbing centers which may be impurity centers such as molecules, atoms and ions. When the photo-absorbing centers are resonantly excited (e.g. by a laser), the numbers of such centers can be reduced if the solid is kept at a temperature at which a process reverse to the process of this reduction cannot take place without external influence. Such a process of reduction, which is called "persistent spectral hole-burning" is described for the material of the preferred embodiment, comprising dye molecules in thin organic films, e.g. polymer films or Langmuir-Blodgett films, in literature (U. Bogner, Physical Review Letters, Vol. 37, 1976, page 909).

A special application of such reduction process for a "Frequency Selective Optical Data Storage System" is described in U.S. Pat. No. 4,101,976 issued July 18, 1978, in which FIG. 4 illustrates hole burning. GB Patent Specification No. 1,351,812 describes how the number of optical centers absorbing laser light can be changed by applying an electric field, but no optical voltage-memory or voltage-tuned optical memory is described.

SUMMARY OF THE INVENTION

In view of the foregoing, it is a primary object of this invention to provide a voltage-dependent optical device, in particular such a device capable of storing information both about applied voltages and about applied light signals.

Another object of the invention is to provide a device having a property such that by applying a voltage, light can be modulated on passing into or out of the device. Yet another object is to provide a device wherein, with a suitable choice of operating bias, the change in optical characteristics is a linear function of the voltage applied.

After reduction of the number of photo-absorbing centers when the persistent spectral hole is burnt, the number can be increased again by changing the voltage (and/or electric field) so that a reduced transmission of light can be observed when the device is irradiated by narrow-band light at the wavelength at which the hole was burnt. This means that subsequent to hole burning, while applying a certain value of a DC burning voltage V, the hole is filled at least partially as long as a probing voltage is applied, the value of which is chosen different from V. This increase in the number of photo-absorbing centers means electric field induced refilling of the hole; it occurs at the wavelength at which the hole has been burnt. The later excitation of the photo-absorbing centers with light of low intensity, while at the same time applying the probing voltage, ensures that there is no noticeable change in the number of centers (that is, further hole burning is avoided).

By suitable choice of burning voltages, a linearly increasing emission and absorption, or a linearly decreasing transmission or radiation, as a function of voltage can be achieved. Linear characteristics are useful for the modulation of optical signals; such signals may be used in optical information transmission.

Another object of the invention is to provide a device having a rise time of less than 50 nanoseconds and preferably in the subnanosecond range.

Another object of the invention is to provide a device in which low voltage, that is voltages under 15 volts, can be used.

Still another object of the invention is to provide a device employing not crystalline materials, but rather amorphous organic polymers.

A related object is to provide a device comprising a thin film, such as a monomolecular layer system of Langmuir-Blodgett film capable of being easily miniaturized and thus able to obtain high spatial density for large scale integration.

A further object of the invention is to provide a device wherein following the application of a stepwise or continuous voltage function to the material, the voltage function can be subsequently inferred by optically interrogating the material. A related object is to perform the voltage memory function independent of the incidental optical frequency, and further to provide independent voltage memory functions at various optical frequencies whereby data may be stored in the material in independent voltage and optical frequency domains.

Other objects and advantages of the invention will be apparent from the following decription of a preferred embodiment of the invention taken in conjunction with the accompanying drawings.

The above objects are satisfied by the present invention, which embraces both a method and a structure developed for carrying out the method. The inventive method comprises steps of subjecting a solid, having photo-absorbing centers capable of displaying persistent spectral hole burning, to intense monochromatic illumination while maintaining a first voltage across the solid, then removing both the intense illumination and the first voltage, and then reading the optical properties of the solid with a probing voltage. One can thereby obtain information about the magnitude and duration of the first voltage.

Examples of the invention will now be described with reference to the accompanying drawings in which:

DESCRIPTION OF THE PREFERRED EMBODIMENT

Figure 1:
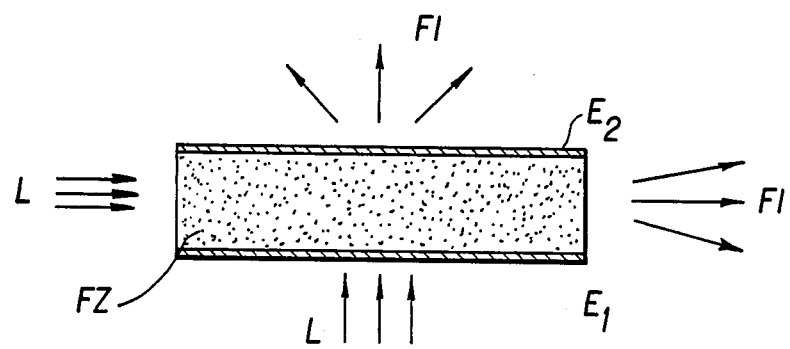
FIG. 1 is a schematic sectional view of a voltage-dependent optical device embodying the invention.
Figure 2:
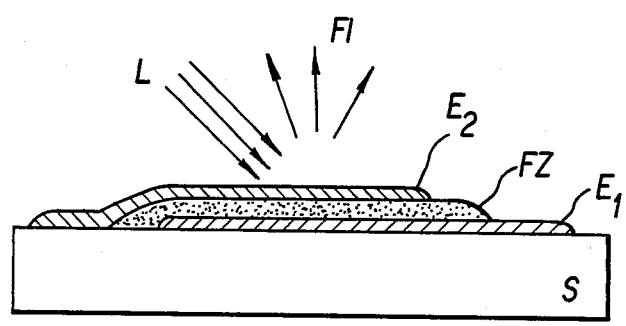
FIG. 2 is a schematic sectional view of a preferred polymer film having dye molecules embedded therein.

In a preferred embodiment, the invention comprises a device such as shown in FIG. 1 or FIG. 2 having voltage-dependent optical qualities. For example, in FIG. 1, solid material $F_2$ is sandwiched between transparent or semi-transparent electrodes $E_1$ and $E_2$ across which a voltage is applied. In the embodiment of FIG. 2, the electrode $E_1$ is composed of a conductive layer of material, preferably a metal film such as aluminum, indium or gold evaporated on a substrate S such as quartz or sapphire. The thickness of the electrode $E_1$ is preferably less than 200 Angstroms and is made with another material that is electrically conductive and semi-transparent, such as indium tin oxide which is conductive even at low temperatures and which can be prepared in a sputter system. Sandwiched between the electrodes $E_1$ and $E_2$ is a solid $F_2$ which, according to this invention, contains or has thereon photo-absorbing centers capable of displaying persistent spectral hole burning (as defined above) under incident narrow-band light. A material which meets the above requirements and which is particularly preferred for this invention is an amorphous polymer film of polyvinylbutyral (PVB) which is resistant to light. This film has added thereto in small concentrations (less than $10^{-4}$ molar) a fluorescent dye such as the aromatic hydrocarbon perylene, which is also resistant to light. To make the material, perylene is preferably dissolved in ethyl alcohol together with the polymer, which is commercially available in the form of a powder. By evaporating the alcohol, a film $F_2$ is formed on the electrode $E_1$ in a typical layer thickness of 1 to 5 micrometers. Ultrathin layers can be produced in the form of so-called Langmuir-Blodgett films as described above.

By the use of Langmuir-Blodgett films of cadmium arachidate, layers doped with perylene can be produced having a thickness of $n \times 28$ Angstroms, where $n=1$ to approximately 200. With these ultrathin layers, reabsorption of light by the perylene molecules can be neglected so that higher concentrations (up to $10^{-2}$ molar) of perylene can be used. Electrode $E_2$ is then made in the same manner as $E_1$ on the upper surface of the layer $F_2$.

In practicing the invention, the device described above is placed in a cryostat and brought to a temperature sufficiently low to prevent spontaneous reversion of optical centers to their original state. In the case of perylene and PVB, the device must be cooled down to the temperature of liquid helium or at least down to temperatures less than 30° K.

Next, the dye molecules are excited to fluorescence by an intense narrow-band light source such as a cw-heluim-cadmium laser having an emission wavelength of 4415.6 Angstroms. Alternatively, the exciting source can be a cw-dye laser pumped with an argon-ion laser, or by a pulsed dye laser pumped with flash-lamps or with a nitrogen laser.

Figure 3A:
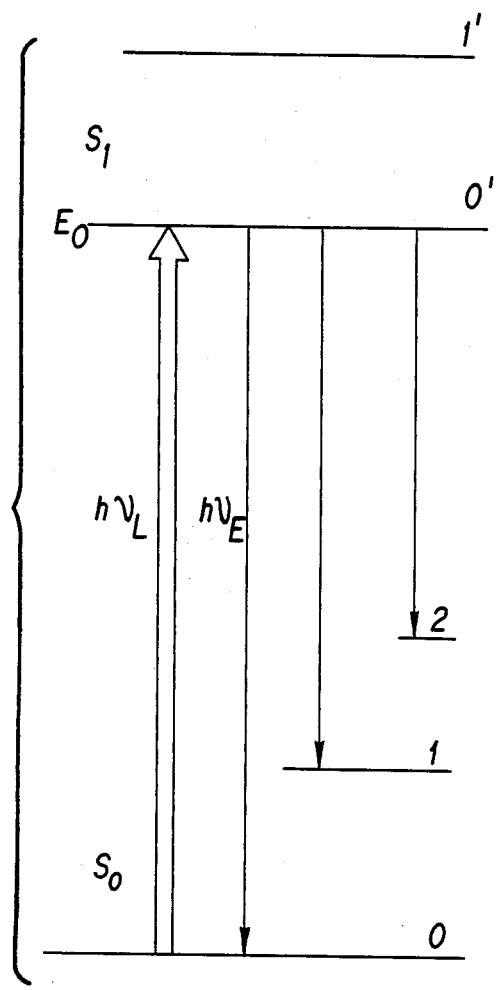
FIG. 3(a) illustrates in schematic form the energy level diagram of an isolated dye molecule.
Figure 3B:
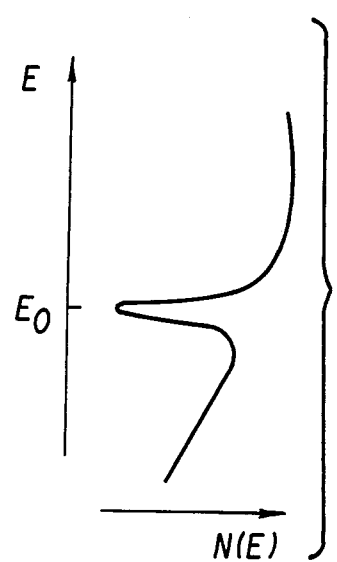
FIG. 3(b) illustrates the effect of spectral hole burning.

Under this "burning" illumination, excitation occurs selectively in the pure electronic level $0'$ or in the first molecular vibration level $1'$ (1st vibronic transition) of the first excited singlet state $S_1$, as shown in FIG. 3. The intensity of the fluorescence decreases with time as the laser light is applied; this is particularly true of the emission of the so-called vibronic zero-phonon lines. These zero-phonon lines are optical transitions from the state $0'$ of the first excited singlet state $S_1$ into the molecular vibration levels $1, 2$, etc. of the singlet ground state $S_0$, as shown in FIG. 3.

The intensity of the 1st vibronic zero-phonon line emitted at a wavelength of 4486 Angstroms decreases with time, under constant burning illumination. For example, with the helium-cadmium laser focused at a power density of 1.0 mW/mm$^2$ on the sample at 1.3° K., in one minute this intensity drops to less than a tenth of its original value, as the number of dye molecules excitable by the laser is reduced. After termination of the intense laser illumination, this reduction persists. The curve shown in FIG. 3(b) demonstrates the distribution intensity or population N of the photo-absorbing centers over the optical spectru, and shows a sharp minimum or "spectral hole" at the frequency $F_0 = hf_l$, where $f_l$ is the frequency of the incident light. During the course of illumination, the number of dye molecules which are excited in the pure electronic level by the laser is considerably reduced; therefore, the level $F_0$ is depopulated. The zero-phonon line belonging to the 1st vibronic transition ($0' \rightarrow 1$) at 4486 Angstroms is displaced approximately 70 Angstroms toward the exciting laser (4415.6 Angstroms) and all other vibronic zero-phonon lines are of a longer wavelength, so that it is possible to separate the diffused laser light from the fluorescent light by means of an interference filter, for example in a detector system.

Figure 4:
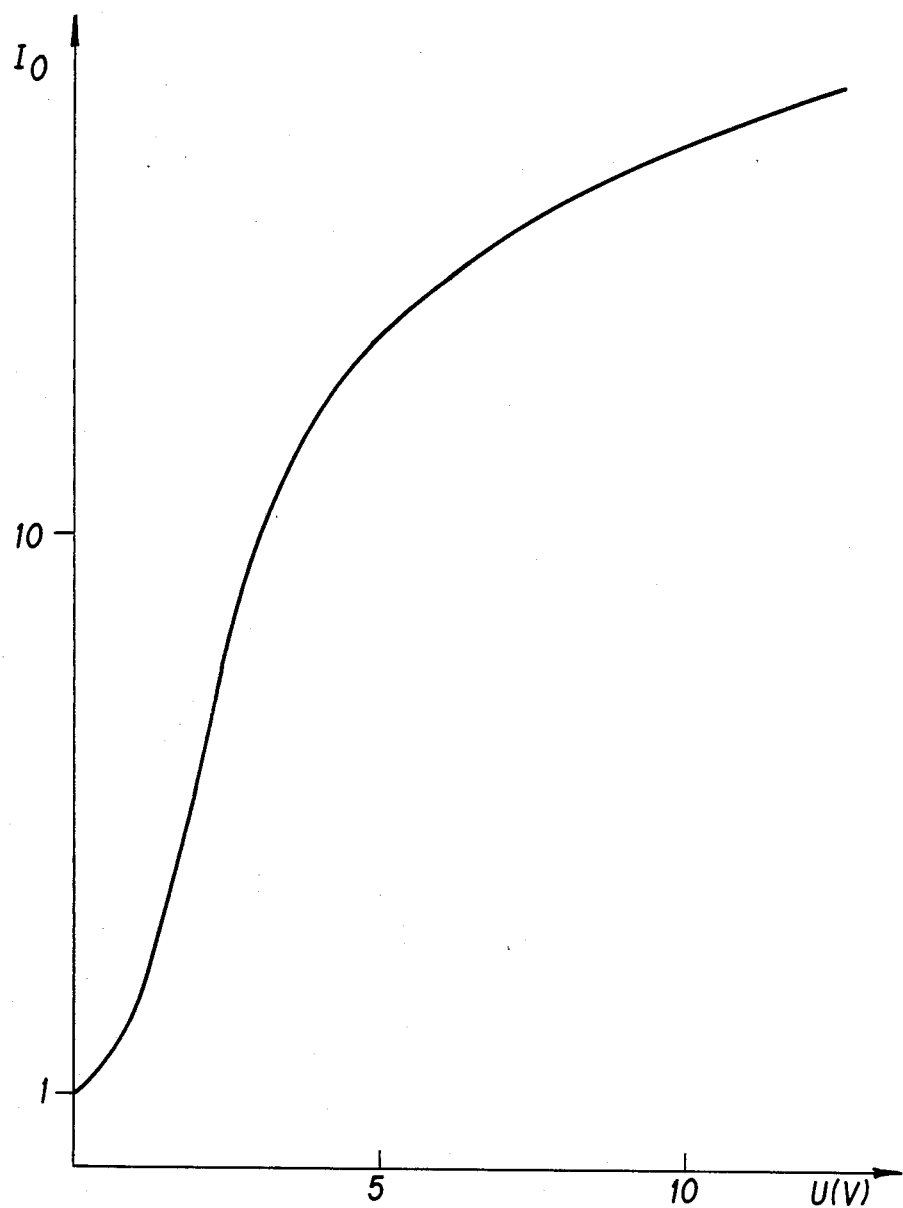
FIG. 4 is a schematic of the optical property of dye molecules in a polymer film as a function of the applied voltage.

Now, if a voltage is subsequently applied to the electrodes, a state of higher fluorescence intensity, as compared to the state without an applied voltage, is observed. The dependence of the fluorescence intensity of the 1st vibronic zero-phonon line upon the voltage is represented in FIG. 4. In order to achieve an increase in the fluorescence of more than 100%, as opposed to before the application of a voltage, a voltage of less than 5 volts suffices for a layer thickness of less than 2 micrometers.

Figure 5:
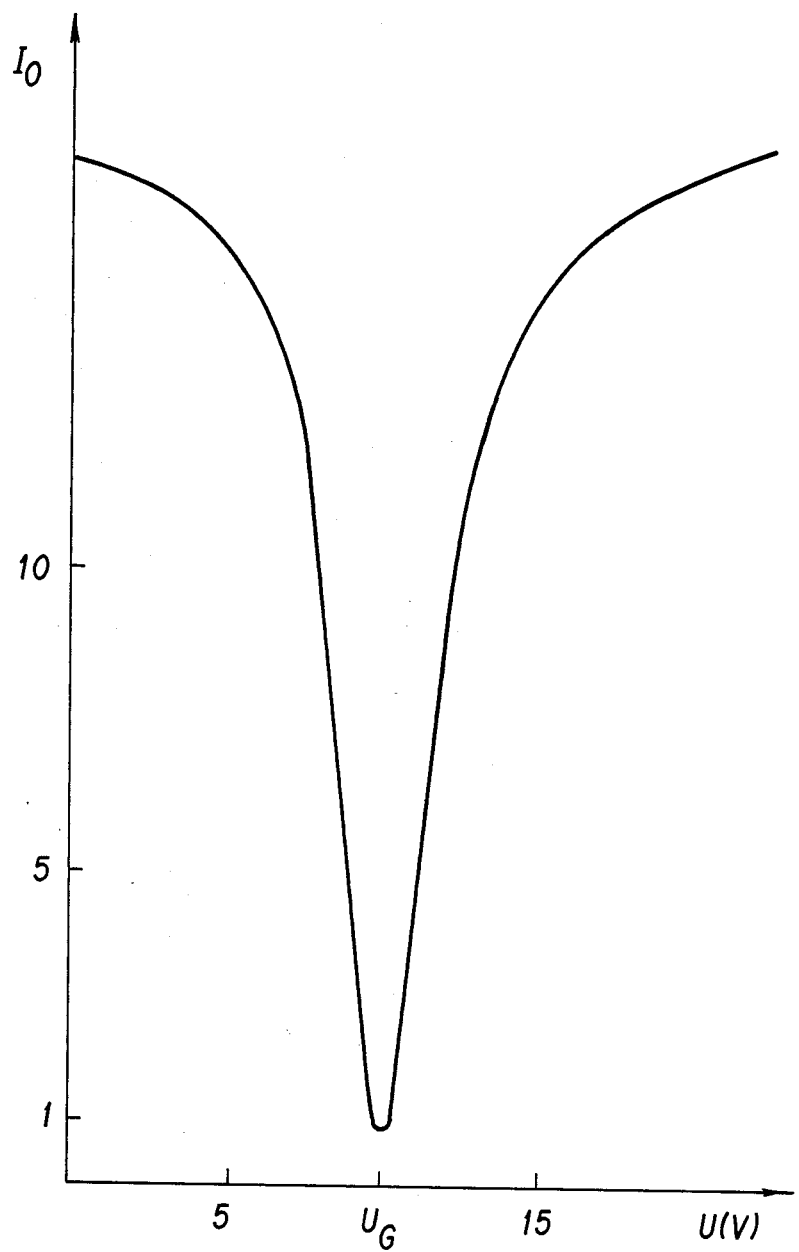
FIG. 5 is a diagram demonstrating the use of the device as a voltage memory.

When the material is subjected to illumination by a reading laser having power density of less than $10^{-3}$ mW/mm$^2$, the reduction of the fluorescence (enhanced by application of a voltage) is negligibly small. However, if the material is again excited by high intensity laser light and simultaneously a "burning voltage" $U_G$ (for example, $U_G = 10$ volts in FIG. 5) is applied, then again the enhanced fluorescence diminishes with the duration of the laser irradiation. When subsequently the device is read with a low power density laser while a "probing" voltage is scanned continuously over the voltage domain, a sharp minimum of optical centers is observed exactly at the burning voltage $U_G$ (see FIG. 5). Thus, a memory for voltages is available because the curve diagram of FIG. 5 is characteristic for the application of a DC voltage, and thus information about the sign and the value of the previously applied voltage can be inferred from FIG. 5.

The minimum fluorescence intensity $I_{min}$ one can obtain by intensive laser irradiation is smaller, the lower the temperature. One obtains a higher value for $I_{min}$ through a temperature increase or after irradiation with phonons, for example with a heat pulse, and the spectral hole can thus be all or partially refilled. By such means the voltage memory can be erased.

At a fixed temperature, $I_{min}$ is the lowest when a spectral hole is burnt only at a single voltage. If a second spectral hole is burnt by irradiation at a second voltage, then one obtains subsequently an increase in $I_{min}$ for all voltage values, both at the first applied voltage as well as at later applied voltages. Under otherwise equal conditions, $I_{min}$ has the lowest value for that voltage at which the last hole was burnt.

The capability of obtaining a voltage memory is attributable to the fact that while applying a voltage, the optical properties of the material are changed. That is, the fluorescence emission and the absorption of the photo-absorbing centers are reduced by persistent spectral hole burning, and subsequently, these optical properties may be read as a function of the probing voltage. Curves of the optical properties are thereby obtainable which reveal the previously applied voltage. For example, while scanning the material with the probing voltage, if a DC burning voltage $U_G$ was previously applied, a minimum in fluorescence intensity $I_F$ is obtained exactly at the value $U_G$. If an AC burning voltage ($U = U_o \sin\omega t$) was previously applied, one obtains a broad minimum, which extends from $+U_o$ to $-U_o$. The voltage memory also enables an inference to be made about the duration over which the voltage was applied. Whether with or without an applied voltage, the fluorescence intensity decreases with the duration of the irradiating light so that consequently, information is obtainable about the duration during which the voltage was applied or about the temporal overlapping of a voltage and light irradiation. This information can be inferred from the changed optical properties, such as the changed fluorescence intensity of the material.

Furthermore, at a certain voltage, for example at zero volts, it can be determined whether the fluorescence was reduced also at another voltage. The fluorescence intensity which is reached at the last-most applied voltage is the lowest, under otherwise the same operating conditions. When several voltages, in particular several DC voltages are applied to the sample in succession, with the same duration, the function of voltage memory provides also information about the chronological order or sequence in which the voltages were applied. The later the voltage was applied in this sequence, the lower is the fluorescence obtained while reading the voltage memory contents of the material.

The applied voltage may be changed several times, for example step-wise. Different functions and/or procedures or the same function and/or precedure may be used at the different voltages, thus multiplying the number of storage places in the memory, increasing the bit density.

The device described above can work also as a fast, low voltage activated switch for light as well as a connecting or coupling element between electrical and/or electronic components of a system and the optical elements which may be useful in digital and analog technology. To obtain a linear relation of optical property change to applied field, suitable burning voltages are applied. After the reduction of the number of photo-absorbing centers (i.e. after hole burning) at a certain voltage and/or electric field, the optical properties of the device, for example the transmission and the absorption, are changed by changing the applied field or voltage.

The device can thus operate as an optical switch (light barrier) or to change the light emission of the photo-absorbing centers coupled out of the solid or to change the coupling of incident light into the solid, whereby part of the incident narrow-band light is transformed into the light emission of the photo-absorbing centers.

By applying a voltage to the device, part of the monochromatic light (such as laser light) irradiated on to the device is transformed into the emission by the photo-absorbing centers of light at a different frequency, shifted for example more than 300 wave numbers, as for the most part narrow-band light (zero-phonon lines), so that the scattered part of the irradiating light can be separated form the fluorescent emission by simple methods such as interference filters. This means, for example, that in the case of the reproduction or transmission of images (image processing) or data (data processing), the scattered part of the irradiating light can be eliminated without great difficulty. This also makes it possible to transform narrow-band light, in particular laser light, into narrow band light (zero phonon-lines in the fluorescent emission) of a different frequency, e.g. also into different directions and couple it into other devices, which is, in particular, of interest in integrated optics.

As an alternative to the organic dye molecules being located in the interior of the solid, they may be adsorbed on the surface of the solid (in particular of the electrodes).

The optical properties can be entirely or partly set into the state which existed before the reduction in the number of photo-absorbing centers (thus erasing any voltage memory) by irradiation with phonons (i.e., an increased temperature) or by photons (especially by broad- or narrow- band light of different wavelengths or far-infrared radiation). Thus if it is desired to retain the adjusted properties after a probing step, the radiation accompanying the probing voltage must be of an intensity low enough to avoid further hole burning.

Inasmuch as the invention is subject to various changes and modifications, the foregoing description should be regarded only as illustrative of the invention, whose scope is set out in the following claims.

I claim:

1. An electro-optical method comprising steps of
   providing a transparent solid having isolated photo-absorbing centers capable of persistent spectral hole burning when subjected to narrow band light, such burned holes being capable of being filled when the solid is subjected to an electric field;
   maintaining said solid at a temperature at which a process reverse to persistent hole burning cannot take place spontaneously;

burning a first persistent spectral hole in the solid at a first optical frequency by irradiating the solid with narrow band light of said first frequency while applying a first burning voltage of selected sign, value and temporal course to the solid to adjust the characteristics of the solid in dependence on voltage, that is, the optical response of the solid to applied voltage at said first frequency; and burning a second persistent spectral hole in the solid at a second optical frequency by irradiating the solid with narrow band light of said second frequency while applying a second burning voltage of selected sign, value and temporal course to the solid to adjust the optical characteristics of the solid at said second frequency;

whereby one may separately adjust the optical characteristics at separate frequencies, so that a voltage dimension is introduced as an additional dimension, that is, in addition to the frequency dimension.

2. The invention of claim 1 wherein said solid is adjusted for at least one optical frequency as a voltage activated optical switch so that an optical property of the solid is changed by altering the applied voltage while irradiating the solid with radiation including the frequency at which the spectral hole was burnt.

3. The invention of claim 1 wherein the solid is adjusted for at least one optical frequency as a voltage induced light modulator by adjusting the optical properties of the solid so that the properties change in linear relationship to the applied voltage over at least part of the voltage range.

4. The invention of claim 1 wherein the solid is adjusted for at least one optical frequency as a voltage induced light frequency transformer so that varying the applied probing voltage changes the relationship between the incident light and a light emitted by the photo-absorbing centers of the solid.

5. The invention of claim 1, wherein adjustment of the solid is used for operation as an optical data storage device by burning a plurality of persistent spectral holes therein at different optical frequencies, while applying a burning voltage that is changed in a plurality of stepwise direct current voltage changes so that the voltage dimension is used as an additional storage dimension in addition to the frequency dimension.

* * * * *